(12) United States Patent
Liu et al.

(10) Patent No.: US 7,710,196 B2
(45) Date of Patent: May 4, 2010

(54) AC DIFFERENTIAL CONNECTION ASSEMBLY BETWEEN A TRANS-IMPEDANCE AMPLIFIER AND A POST AMPLIFIER FOR BURST MODE RECEIVING

(75) Inventors: Jinxiang Liu, Singapore (SG); HuiJie Du, Singapore (SG)

(73) Assignee: Finisar Corporation, Sunnyvale, CA (US)

( * ) Notice: Subject to any disclaimer, the term of this patent is extended or adjusted under 35 U.S.C. 154(b) by 22 days.

(21) Appl. No.: 12/235,907

(22) Filed: Sep. 23, 2008

(65) Prior Publication Data
US 2010/0045345 A1    Feb. 25, 2010

(30) Foreign Application Priority Data
Aug. 22, 2008   (SG)  .............. 200806264-8

(51) Int. Cl.
*G06G 7/12*   (2006.01)
*G06G 7/26*   (2006.01)
(52) U.S. Cl. ...................... 327/562; 327/560
(58) Field of Classification Search .......... 327/562, 327/531, 532
See application file for complete search history.

(56) References Cited

U.S. PATENT DOCUMENTS

2005/0238014 A1 * 10/2005 Kang .................. 370/389
2008/0310861 A1 * 12/2008 Wong et al. ............ 398/210

* cited by examiner

*Primary Examiner*—Lincoln Donovan
*Assistant Examiner*—Daniel Rojas
(74) *Attorney, Agent, or Firm*—Workman Nydegger

(57) ABSTRACT

An AC differential connection assembly between a trans-impedance amplifier and a post amplifier for burst mode receiving comprising means for coupling a differential output of the trans-impedance amplifier to a differential input of the post amplifier, the means for coupling comprises a coupling capacitor assembly; and a switching circuit coupled across the differential input of the post amplifier, the switching circuit having an 'on' state with low impedance and an 'off' state with high impedance; wherein during burst mode receiving, the switching circuit is in the 'off' state and the coupling capacitor assembly having a time constant to maintain a stable DC level such that a payload is received accurately by the differential input of the post amplifier; and during an idle period, the switching circuit is in the 'on' state and the coupling capacitor assembly having a time constant to recover a DC level of the differential output of the trans-impedance amplifier.

7 Claims, 3 Drawing Sheets

AC DIFFERENTIAL CONNECTION ASSEMBLY BETWEEN A TRANS-IMPEDANCE AMPLIFIER AND A POST AMPLIFIER FOR BURST MODE RECEIVING

FIELD OF INVENTION

The present invention relates to an AC differential connection assembly between a trans-impedance amplifier and a post amplifier for burst mode receiving.

BACKGROUND ART

The increase in consumer demand for applications such as high definition television, streaming videos, video telephony and other high bandwidth and high speed applications have driven communications to higher level of technology development where service providers are looking towards the field of fiber optics for the next generation of communications. In particular, Passive Optical Networks (PON) have grown in consideration for the implementation of Fiber To The Home (FTTH) networks due to its cost effectiveness in comparison to other existing alternatives resulting from reduced fiber and electronic equipment requirements compared to the existing alternatives.

In general, PON is a point-to-multipoint network architecture consisting of an Optical Line Terminal (OLT) and a plurality of Optical Network Units (ONU), in which data is transmitted upstream and downstream from the ONU to OLT. However, since upstream transmission is multipoint-to-point, ONUs are unable to transmit the data continuously; hence the need for burst mode—where the upstream channel is shared in Time Division Multiplexing (TDM) mode and each ONU is allocated a time slot for the transmission of an optical packet.

As the distance between each ONU and OLT can vary greatly, so does the range of optical signal power levels received by the OLT, with power levels in sequential burst mode packets varying up to ratios of 1000:1 and above. This provides a problem for burst mode receivers, where there is a need to process the signals of vastly differing amplitudes and phases into packets of similar amplitudes and phases.

Conventional burst mode receivers such as that disclosed in U.S. Pat. No. 6,909,082 utilize a DC coupled single-ended solution, with a single trans-impedance amplifier output as opposed to differential outputs. One such burst mode receiver utilizes a fast Automatic Threshold Controller (ATC) mechanism to adjust the gain on an optical signal via means of an Automatic Gain Control (AGC) and sets the threshold accordingly. However, since this single-ended solution only utilizes one of the trans-impedance amplifier's differential outputs in setting up the connection, a sensitivity penalty is suffered as only half of the information is used. There is also a compromise in the symmetry of the input at the post amplifier causing asymmetry output of the same that results in a severe sensitivity penalty.

Other prior art burst mode receivers such as that disclosed in U.S. Pat. No. 6,420,928 use a differential DC connection which AC couples the input signals of the trans-impedance amplifier. The use of a capacitor at the input stage of the trans-impedance amplifier results in loss of burst mode data due to the charging and discharging times of the capacitor. This is due to the fact that the need for a short time constant in order to recover DC levels as quickly as required contradicts the need for a long time constant during idle periods where a stable DC level is required.

SUMMARY OF INVENTION

One embodiment of the invention includes an AC differential connection assembly between a trans-impedance amplifier and a post amplifier for burst mode receiving. The AC differential connection assembly comprises means for coupling a differential output of the trans-impedance amplifier to a differential input of the post amplifier. The means for coupling comprises a coupling capacitor assembly. The AC differential connection assembly further comprises a switching circuit coupled across the differential input of the post amplifier, the switching circuit having an 'on' state with low impedance and an 'off' state with high impedance; wherein during burst mode receiving, the switching circuit is in the 'off' state and the coupling capacitor assembly having a time constant to maintain a stable DC level such that a payload is received accurately by the differential input of the post amplifier; and during an idle period, the switching circuit is in the 'on' state and the coupling capacitor assembly having a time constant to recover a DC level of the differential output of the trans-impedance amplifier.

The present invention consists of several novel features and a combination of parts hereinafter fully described and illustrated in the accompanying drawings, it being understood that various changes in the details may be made without departing from the scope of the invention or sacrificing any of the advantages of the present invention.

BRIEF DESCRIPTION OF THE ACCOMPANYING DRAWINGS

For the purpose of facilitating an understanding of the present invention, there is illustrated in the accompanying drawings, from an inspection of which, when considered in connection with the following description, the invention, its construction and operation and many of its advantages would be readily understood and appreciated.

DETAILED DESCRIPTION OF THE PREFERRED EMBODIMENTS

The present invention relates to an AC differential connection assembly between a trans-impedance amplifier and a post amplifier for burst mode receiving. Hereinafter, this specification will describe the present invention according to the preferred embodiments of the present invention. However, it is to be understood that limiting the description to the preferred embodiments of the invention is merely to facilitate discussion of the present invention and it is envisioned that those skilled in the art may devise various modifications and equivalents without departing from the scope of the appended claims.

The AC differential connection assembly between a trans-impedance amplifier and a post amplifier for burst mode receiving can be incorporated into Optical Line Terminal Small Form Factor or Small Form Pluggable transceiver modules of host boards, or the like, to cater for burst mode transmission received from Optical Network Units. The AC differential connection assembly according to the embodiments of the invention can be compliant with the Optical Line Terminal burst mode receiving protocol. Embodiments of the invention can significantly improve the sensitivity performance of the host boards, improve the symmetry of the post amplifier outputs and reduce the DC offset of the post amplifier outputs, which can be important when there is DC coupling to the host board.

Burst mode receiving is different from continuous receiving and there is normally a sensitivity penalty associated with burst mode transmission. Conventional single-ended solutions that attempt to overcome this introduce unbalance or asymmetry at the input of the post-amplifier that severely degrades sensitivity. Embodiments of the invention reduce the sensitivity penalty by optimizing the interconnection between the trans-impedance amplifier and the post amplifier. Additionally, to comply with the Optical Line Terminal burst mode receiving protocol, embodiments of the invention provide for two time constants. A short time constant is applied to recover the DC level as quickly as required. A long time constant serves to provide stable DC level for receiving data transmission consisting of packets of various data formats.

Figure 1:
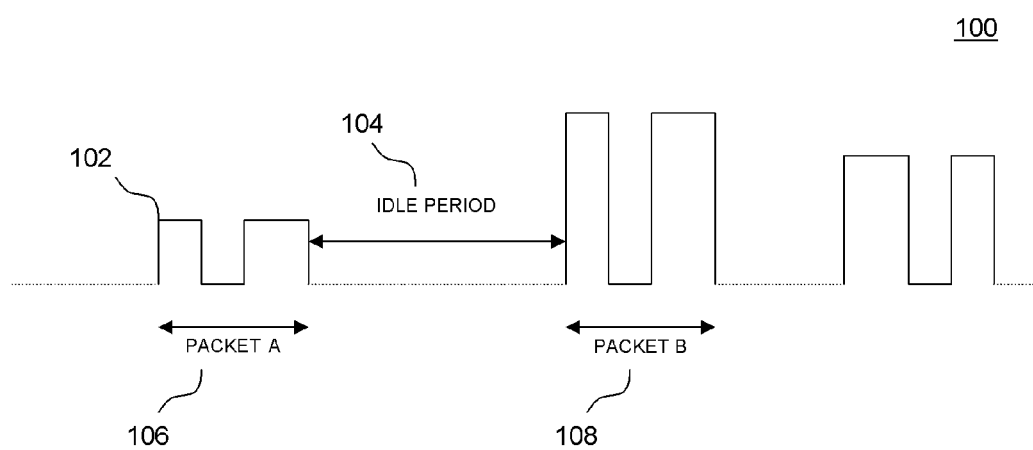
FIG. 1 is an illustrative view of data formats during burst mode receiving and during an idle period.

The data transmission of burst mode receiving consists of packets of various data formats. Reference is first made to FIG. 1. FIG. 1 is an illustrative view of the data formats during burst mode receiving and during an idle period. Point (102) illustrates the start of the burst mode data, where a first packet, packet A (106) is received with a particular amplitude and phase. Subsequently, there is an idle period (104) between two packets of burst mode data. A second packet, packet B (108) is the next packet of burst mode data received with a different amplitude and phase. Embodiments of the invention optimize the interconnection between the trans-impedance amplifier and the post amplifier to process packet A (106) and packet B (108), both of differing amplitudes and phases into packets of similar amplitudes and phases.

Figure 2:
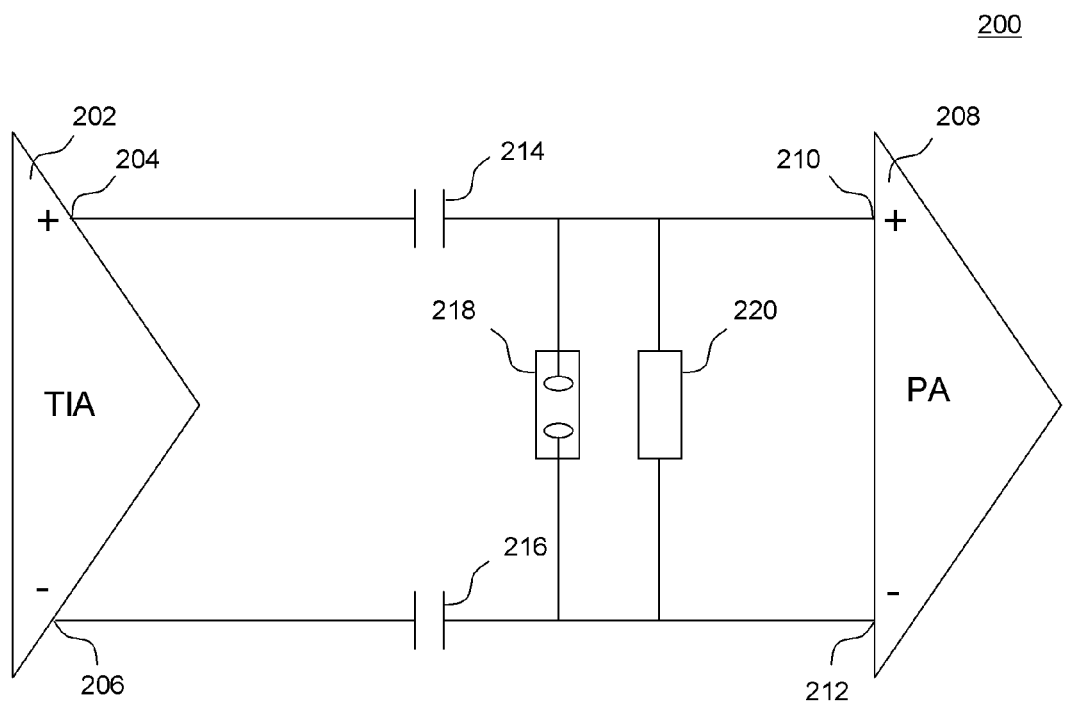
FIG. 2 is an illustrative view of an AC differential connection assembly between a trans-impedance amplifier and a post amplifier for burst mode receiving.

Reference is now made to FIG. 2. FIG. 2 is an illustrative view of an AC differential connection assembly (200) between a trans-impedance amplifier (202) and a post amplifier (208) for burst mode receiving. The AC differential connection assembly (200) for burst mode receiving comprises two main components. The first component includes a means for coupling the differential output of the trans-impedance amplifier (202) to the differential input of the post amplifier (208). The second component includes a switching circuit (218) coupled across the differential input of the post amplifier (208).

In the embodiment of FIG. 2, the means for coupling is a capacitive coupling or AC coupling that comprises a coupling capacitor assembly (214, 216) wherein the coupling capacitor assembly (214, 216) comprises a pair of capacitors. The first capacitor (214) is connected between a first output terminal (204) of the trans-impedance amplifier (202) and a first input terminal (210) of the post amplifier (208). The second capacitor (216) is connected between a second output terminal (206) of the trans-impedance amplifier (202) and a second input terminal (212) of the post amplifier (208).

In another embodiment of the invention, the means for coupling may comprise a plurality of coupling capacitors that inherently fashions capacitive coupling or AC coupling. The description and drawings herein refer to the means for coupling as the first capacitor (214) and the second capacitor (216) for convenience of explanation and illustration only.

The switching circuit (218) is connected between the first input terminal (210) of the post amplifier (208) and the second input terminal (212) of the post amplifier (208). The switching circuit (218) has an 'on' state with low impedance and an 'off' state with high impedance. Alternatively, the switching circuit (218) may also be capable of variable impedance, such that the 'on' state of the switching circuit (218) has lower impedance than that of the 'off' state of the switching circuit (218).

The AC differential connection assembly (200) according to the embodiments of the invention further comprises a load (220), the load (220) having impedance larger than that of the 'on' state of the switching circuit (218). The load (220) is parallel to the switching circuit (218). The load (220) is connected between the first input terminal (210) of the post amplifier (208) and the second input terminal (212) of the post amplifier (208).

When optical burst mode data is received, the trans-impedance amplifier (202) converts a corresponding electrical signal from a photo-detector to a differential electrical burst signal, wherein differential outputs at the first output terminal (204) and the second output terminal (206) of the trans-impedance amplifier (202) are symmetrical to one another.

During burst mode receiving (106, 108), a master reset signal configures the switching circuit (218) in the 'off' state. Since the impedance of the switching circuit (218) is minimal compared to the impedance of the load (220), the impedance across the first input terminal (210) of the post amplifier (208) and the second input terminal (212) of the post amplifier (208) increases correspondingly. This causes the coupling capacitor assembly (214, 216) to have a time constant sufficiently large to maintain a stable DC level such that the payload (e.g. the burst mode data) is received accurately by the differential input of the post amplifier (208). The sufficiently large time constant slows the decay of the DC level of the trans-impedance amplifier (202) outputs which allows for accurate receiving of the payload, particularly during long stretches of 1's and 0's where the lack of a transition in the burst mode data requires the DC level to be maintained. With this differential connection a gain in sensitivity of approximately 1.5 dBm can achieved during burst mode receiving (106, 108) in embodiments of the invention.

During an idle period (104) between two packets of burst mode data, the switching circuit (218) is in the 'on' state resulting in the coupling capacitor assembly (214, 216) having a time constant sufficiently small to recover a DC level of the differential output of the trans-impedance amplifier (202). The sufficiently small time constant allows the coupling capacitor assembly (214, 216) to be charged fast enough to recover the DC level of the trans-impedance amplifier (202) outputs, which allows the receiver to adjust quickly to the differing amplitudes of the input signal.

In addition to the coupling capacitor assembly (214, 216) and the switching circuit (218), the AC differential connection assembly (200) may comprise a matching circuit, to match the differential output of the trans-impedance amplifier (202) to the differential input of the post amplifier (208). Additionally, the AC differential connection assembly (200) may also comprise an isolation circuit to isolate the differential output of the trans-impedance amplifier (202) from the differential input of the post amplifier (208).

Figure 3:
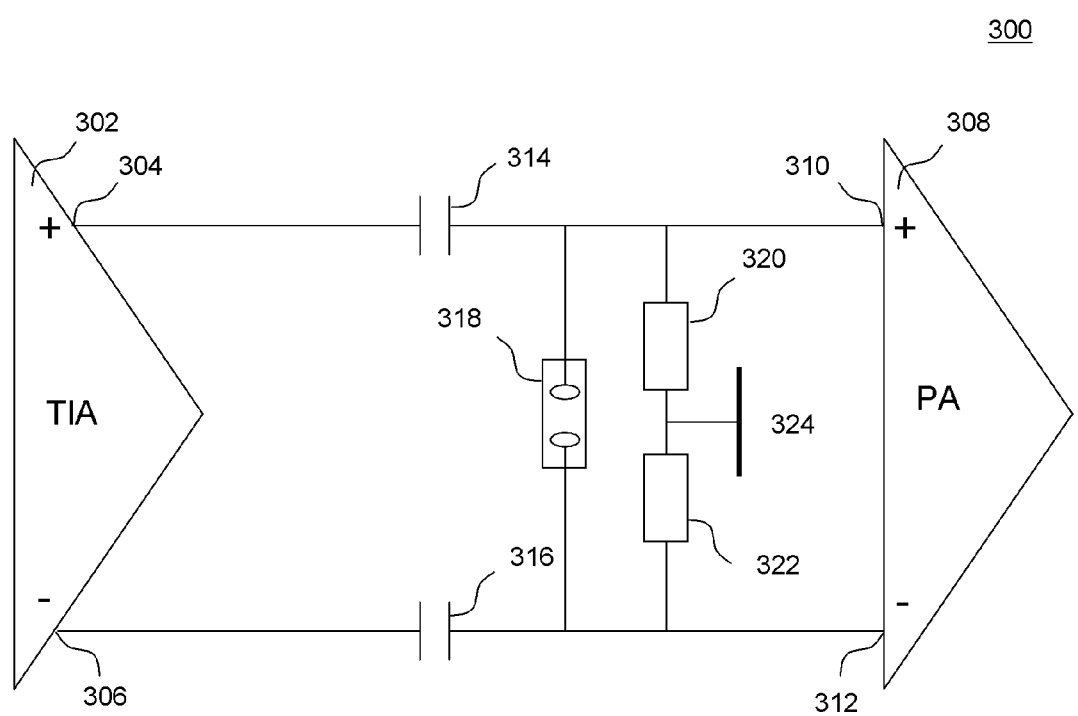
FIG. 3 is an illustrative view of another embodiment of an AC differential connection assembly between a trans-impedance amplifier and a post amplifier for burst mode receiving showing a variable impedance provided for the AC differential connection assembly.

Reference is now made to FIG. 3. FIG. 3 is an illustrative view of another embodiment of an AC differential connection assembly (300) between a trans-impedance amplifier (302) and a post amplifier (308) for burst mode receiving. The AC differential connection assembly (300) of FIG. 3 is similar in some respects to the AC differential connection assembly (200) of FIG. 2. For instance, the AC differential connection assembly (300) of FIG. 3 includes means for coupling the differential output of the trans-impedance amplifier (302) to the differential input of the post amplifier (308) and a switching circuit (318) coupled across the differential input of the post amplifier (308). The means for coupling can include a capacitive or AC coupling that includes coupling capacitor assembly (314, 316). In this embodiment of the invention, the AC differential connection assembly (300) further comprises a plurality of loads (320, 322), the plurality of loads (320, 322) having a reference voltage source (324) between the plurality of loads (320, 322) to generate a DC bias and having impedance larger than that of the 'on' state of the switching circuit (318). This configuration provides a variable impedance for the AC differential connection assembly (300).

The invention claimed is:

1. An AC differential connection assembly between a trans-impedance amplifier and a post amplifier for burst mode receiving, the AC differential connection assembly comprising:
    means for coupling a differential output of the trans-impedance amplifier to a differential input of the post amplifier, the means for coupling comprising a coupling capacitor assembly; and
    a switching circuit coupled across the differential input of the post amplifier, the switching circuit having an 'on' state with low impedance and an 'off' state with high impedance; wherein
        during burst mode receiving, the switching circuit is in the 'off' state and the coupling capacitor assembly having a time constant to maintain a stable DC level such that a payload is received accurately by the differential input of the post amplifier; and
        during an idle period, the switching circuit is in the 'on' state and the coupling capacitor assembly having a time constant to recover a DC level of the differential output of the trans-impedance amplifier.

2. An assembly according to claim 1, wherein the coupling capacitor assembly comprises a pair of capacitors.

3. An assembly according to claim 1, wherein the switching circuit is capable of variable impedance, such that the 'on' state of the switching circuit has lower impedance than that of the 'off' state of the switching circuit.

4. An assembly according to claim 1, wherein the AC differential connection assembly further comprises a load, the load having impedance larger than that of the 'on' state of the switching circuit.

5. An assembly according to claim 1, wherein the AC differential connection assembly further comprises a plurality of loads, the plurality of loads having a reference voltage source between the plurality of loads to generate a DC bias and having impedance larger than that of the 'on' state of the switching circuit.

6. An assembly according to claim 1, wherein the AC differential connection assembly further comprises a matching circuit, to match the differential output of the trans-impedance amplifier to the differential input of the post amplifier.

7. An assembly according to claim 1, wherein the AC differential connection assembly further comprises an isolation circuit to isolate the differential output of the trans-impedance amplifier from the differential input of the post amplifier.

* * * * *